United States Patent [19]
Cooper et al.

[11] Patent Number: 5,609,491
[45] Date of Patent: Mar. 11, 1997

[54] ELECTRICAL CONNECTOR FOR PRINTED CIRCUIT BOARD ASSEMBLY

[75] Inventors: Ralph M. Cooper, Clemmons; Donald G. Stillie, Winston-Salem, both of N.C.

[73] Assignee: The Whitaker Corporation, Wilmington, Del.

[21] Appl. No.: 402,079

[22] Filed: Mar. 10, 1995

[51] Int. Cl.⁶ .................................................. H01R 13/04
[52] U.S. Cl. ............................................ 439/79; 439/494
[58] Field of Search .................................. 439/494, 492, 439/499, 79, 80, 692, 733.1, 76.1, 83

[56] References Cited

U.S. PATENT DOCUMENTS

| | | | |
|---|---|---|---|
| 4,767,350 | 8/1988 | Cooper et al. | 439/271 |
| 4,993,968 | 2/1991 | Guletsky et al. | 439/492 |
| 5,100,342 | 3/1992 | Olsson | 439/494 |
| 5,201,661 | 4/1993 | Ii | 439/79 |
| 5,269,694 | 12/1993 | Kachlic et al. | 439/83 |

*Primary Examiner*—Neil Abrams
*Assistant Examiner*—Barry Matthew L. Standig
*Attorney, Agent, or Firm*—Bruce J. Wolstoncroft

[57] ABSTRACT

An assembly for connecting inputs and outputs to a printed circuit board subassembly is disclosed. The assembly includes an electrical connector 2 that includes a housing 4 and a plurality of terminals 6 located in openings 28 extending between a mating face 22 and a rear face 24 on the housing 4. Both the terminals 6 and the openings 28 are C-shaped and adjacent terminals and openings are inverted. The terminals have a contact tab portion 12 for forming a separable connection with a mating connector 56 and a termination or weld tab section 14 for attachment to a conductor 8 joining each connector terminal 6 to a printed circuit board 10. The termination tabs 14 are located in a single row to facilitate the attachment of a wire 8 to each terminal 6 by a process such as the use of an ultrasonic bonding applicator 62.

48 Claims, 6 Drawing Sheets

ELECTRICAL CONNECTOR FOR PRINTED CIRCUIT BOARD ASSEMBLY

BACKGROUND OF THE INVENTION

1. Field of the Invention

This invention relates to electrical connectors used to establish an electrical connection between a printed circuit board and a plurality of input and output conductors. More specifically, this invention relates to an input/output connector assembly that is a part of an enclosure in which the printed circuit board is positioned.

2. Description of the Prior Art

Multiposition printed circuit board electrical connector headers are typically used to interconnect printed circuit boards to electrical cables or a wire harness. These headers typically include printed circuit board pins mounted in the header in several rows. The terminal pins are typically either solid pins or stamped and formed pins. The pins extend through a molded header housing between a mating face and a rear face. An electrical connector receptacle attached to the conductors in a cable or harness is mated to the header and the header pins at the header mating face. The opposite ends of the pins are attached to a printed circuit board, typically by soldering the pins to the board. Both straight pin and right angle pin versions of these headers are common.

One conventional use of these headers is as an input/output device for the electrical component including the printed circuit board. In most cases, the header is mounted on one edge of the printed circuit board. Components are typically mounted in an enclosure or box or behind a bulkhead, and the input/output header extends through a hole in one wall of the enclosure.

One common form of such headers is a right angle header. The mating interface of right angle header permits insertion of a mating connector on the side of a printed circuit board. The pins or terminals on right angle headers must however be bent at right angles. Typically the pins or terminals in conventional right angle headers are bent after the terminals are inserted into the header housing. The right angle header is then mounted on the printed circuit board with the mating portion of the header extending horizontally.

If a right angle header of this type is mounted in an enclosure containing a printed circuit board, the header is typically positioned in an opening on the side of the enclosure. If the enclosure must be sealed, a seal must then be provided between the header housing and the enclosure opening in which the connector is mounted. An alternate approach, which eliminates this seal, is to mold the header as an integral part of the enclosure. For example, the header housing can be molded on the side wall of the enclosure with openings molded in the enclosure for the insertion of terminals or pins. If a right angle configuration is used, the terminals would typically be bent at right angles after they have been inserted through openings in the side wall of the enclosure. The header terminals would then be attached to the printed circuit board, for example by soldering the header terminals or pins to the printed circuit board. With this approach, the bending operation must be performed on a subassembly including the enclosure that is larger than the header and is typically more cumbersome. The enclosure must also be part of the soldering operation, and the enclosure must be molded using a material that can withstand the temperatures encountered in the soldering operation. If the enclosure includes a bottom surface, the header terminals or pins cannot be wave soldered and a surface mount soldering operation, with inherently higher temperatures, must be employed. Materials that can withstand these higher temperatures are typically more expensive.

Header assemblies are commonly used in automotive electronics applications. For example, such connector or enclosure assemblies can be employed in MAP or manifold absolute pressure sensors. A typical prior art assembly of this type includes a lead frame insert molded in a housing with a printed circuit board located in a central housing cavity. Contact tabs, formed from the lead frame, protrude from the sides of the housing or are located in mating cavities on the side of the housing. Contact fingers, also formed from the lead frame, extend into the central cavity containing the printed circuit board. In some cases the printed circuit board is not in the same plane as the lead frame. The contact fingers are formed to extend between the two planes are soldered to the printed circuit board or attached in other conventional means. An alternative method of attaching contact tabs in one plane with a printed circuit board in another plane is to wire bond the contact tabs to the printed circuit board. In this method, the rear of the contact tabs extend into the housing cavity. Horizontal surfaces in the cavity support the rear of the contact tabs, and a wire is bonded to the top of these tabs using a conventional wire bonding head. The wire is than bonded to a pad on the printed circuit board. This prior art approach involves bonding a wire on two different planes and is some applications access to the lower printed circuit board can be restricted. Placement of components can also be dictated by wire bonding considerations, further limiting the options available for design of the assembly. With dual row contact tabs, wire bonds must be made to contact tabs on different layers. Each lower tab can either be immediately below the corresponding upper tab or only slightly offset. The lower wire bond must therefore be fabricated before the upper bond. Wire bond reliability is a problem and a significant number of defective assemblies can be anticipated. Repair of the lower wire bond is especially difficult, because access is difficult. Although wire bonding does offer some advantages in assemblies of this type, there are still attendant difficulties which are overcome by the invention described herein.

SUMMARY OF THE INVENTION

The new connector terminal design shown in the representative embodiments of this invention simplifies the use of wire bonding to attach contact tabs to printed circuit boards. This connector uses terminals that are preferably stamped and formed from a flat blank. Each terminal has a contact tab extending in an opposite direction from a termination tab. The tabs are in separate planes, and are joined by a central support section. The contact tab centerline is laterally offset from the termination tab centerline, and the terminals are mounted in openings in a housing. Preferably, termination or weld tabs include wire bondable sections with an aluminum inlay for use in ultrasonically bonding a wire to each terminal. Other methods of attaching conductors to the termination tabs are also possible. In the preferred embodiments, the contact tabs and the termination or weld tabs are in parallel planes, and the terminals are C-shaped. Adjacent C-shaped terminals can be inverted so that the contact tabs are in two rows, but the termination tabs are in a single row to simplify wire bonding.

This connector uses a connector housing having C-shaped openings with terminals inserted in these C-shaped openings. Adjacent openings are inverted so that identical terminals can be inverted so that contact tabs on one end are positioned in two spaced apart rows while the termination tabs are positioned in a single row to facilitate attachment of conductors to these terminals. This housing can be an integral part of an enclosure to which the terminals are connected.

The connector disclosed herein need not be attached directly to the printed circuit board. An assembly including both an electrical connector and a bridging terminal can be used to connect each connector terminal first to a bridging terminal which is then connected to a printed circuit board. Preferably a wire is ultrasonically bonded between each connector terminal and each bridging terminal.

A bridging connector which includes bridging terminals mounted on a pedestal or bridge body can be used to simplify electrical interconnection of contact terminal and a printed circuit board. Each bridging terminal is attached the printed circuit board, preferably by a solder interconnection, and includes a wire bonding section located on top of the bridge body. This bridge thus provides a raised surface which is easily accessible for ultrasonically bonding wires to the bridging terminals.

This application discloses a method of connecting inputs and outputs to a printed circuit board by bonding wires to connector terminals and connecting these wires to the printed circuit board. Bridging terminals are used in the preferred embodiments, but the wires can be ultrasonically bonded directly between the printed circuit board and a single row of termination tabs in C-shaped terminals. The termination tabs can also be positioned directly in contact with the bridging terminals and ultrasonically bonded directly to the bridging terminals.

Connectors with terminals of the type defined herein are useful as input/output connectors in assemblies which include an enclosure with a printed circuit board component mounted in the enclosure. These connectors can be integral parts of the enclosure with the terminals extending through the housing wall. The terminals can be easily sealed if necessary.

A single terminal can be used to in this connector with two rows of contacts for mating with electrical connector receptacles which typically include contacts mounted in two rows. The opposite end of each terminal is however located in a single row to simplify connection of the terminals to the printed circuit board. This single row of terminals can be ultrasonically bonded to bare wires as part of the interconnection of the terminals to the printed circuit board. Other conventional processes can be used to interconnect the terminals to the printed circuit board. By using a separate connection, it is not necessary to bend the terminals after insertion into the housing. This bending operation is more complicated when the housing is included as an integral part of the enclosure.

A bridging connector simplifies the connection of the terminals to the printed circuit board. The bridging connector, which is attached to the printed circuit board, raises the connection of the bonding wire above the surface of the printed circuit board where it is more accessible.

DETAILED DESCRIPTION OF THE PREFERRED EMBODIMENTS

Electrical connector 2 includes a molded connector housing 4 and a plurality of terminals 6 positioned in the housing. The housing 4 is molded from a conventional thermoplastic such as glass filled nylon to provide low warpage. The terminals 6 are stamped and formed from a flat electrically conductive material, such as brass, with conventional gold plating and tin lead plating on selected areas of the terminals.

Figure 1:
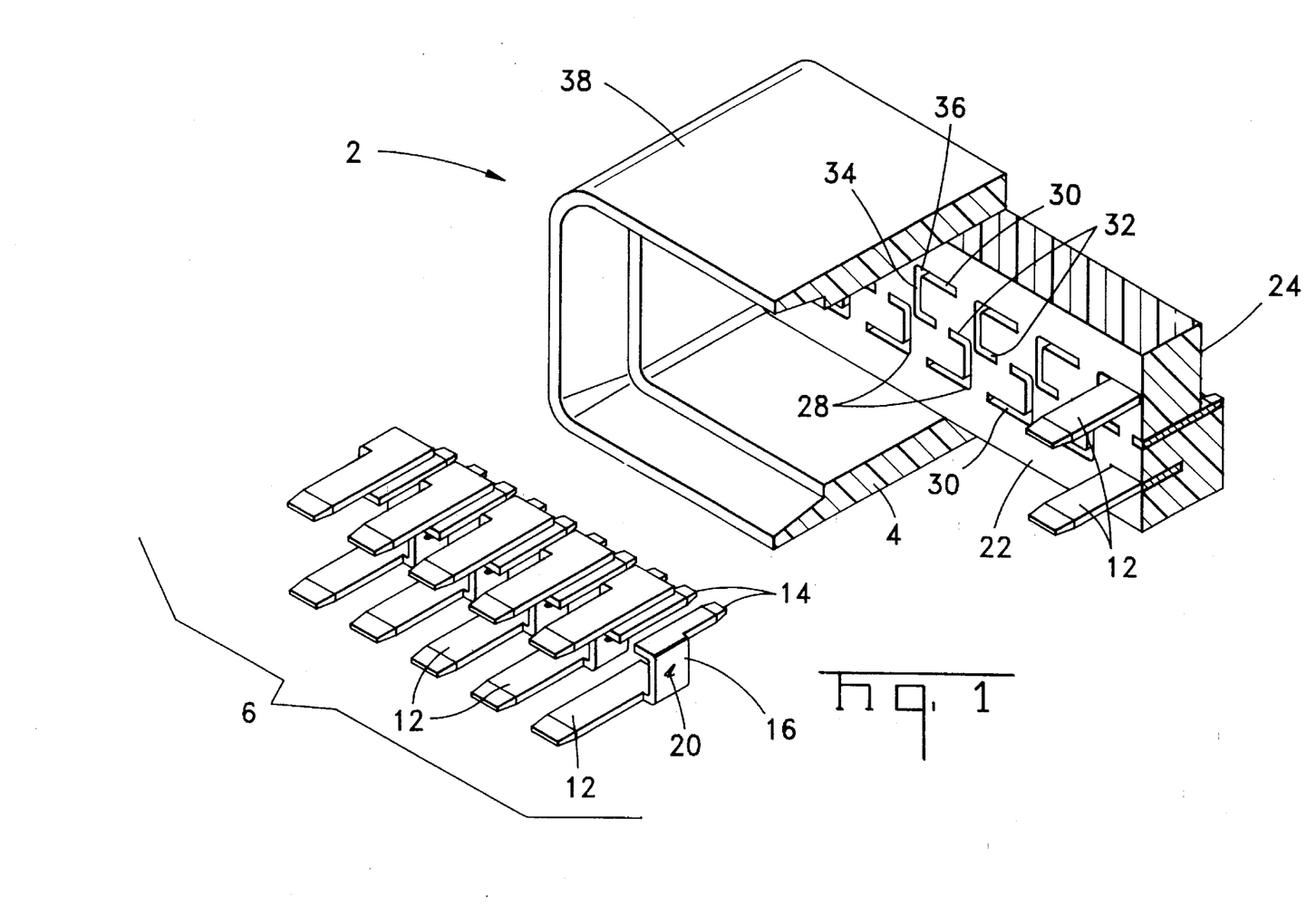
FIG. 1 is a fragmentary exploded perspective view of a connector housing and the terminals used in this connector.
Figures 2, 3:
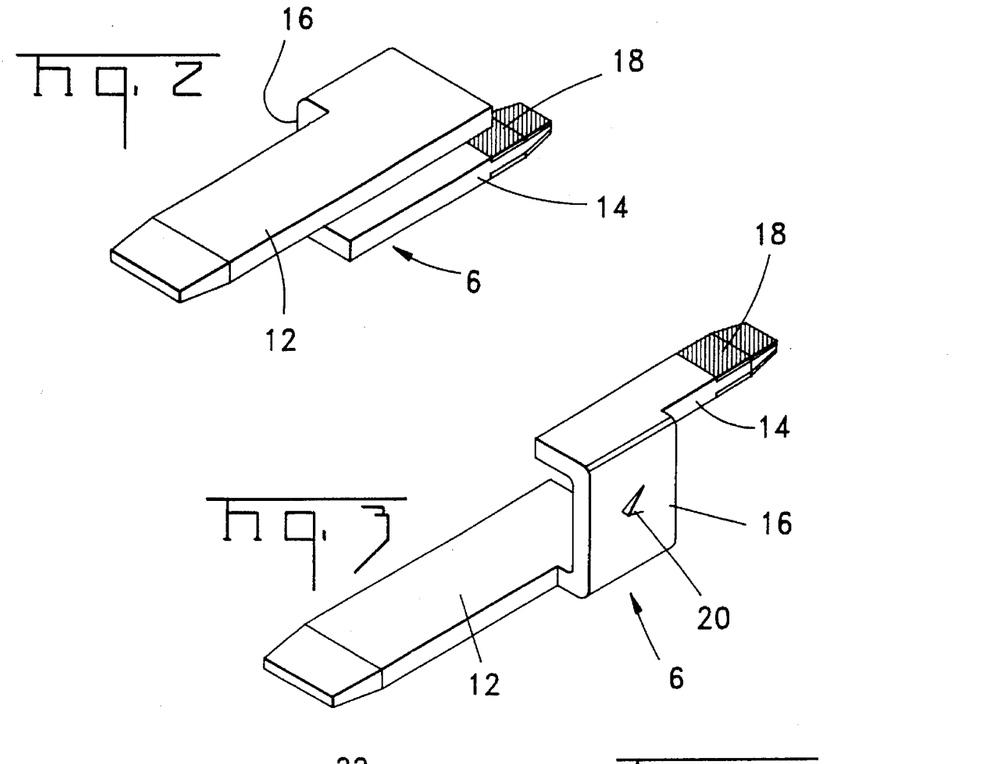
FIG. 2 is a perspective view of a single terminal in one orientation with the contact tab portion on the top. Some of the contacts would be mounted in the connector housing in this orientation.
FIG. 3 is a perspective view of a single terminal in another orientation with the contact tab portion on the bottom. Other contacts would be mounted in the connector housing in this orientation.

Each of the terminals 6 has a terminal contact tab or section 12 on a first end. Each terminal 6 has a termination or weld tab 14 on the opposite second end of the terminal. In the preferred embodiment, this termination section 14 comprises a wire bonding section. A central terminal support section 16, which is generally C-shaped in cross section, is located between the contact tab section 12 and the termination or weld tab section 14. As shown in FIGS. 1–3, the contact tab section 12 extends forward from one branch of the C-shaped support section 16. The termination or weld tab section 14 extends rearward from the other branch of the C-shaped support section 16. In the preferred embodiment, the contact tab section is in a first plane and the termination or weld tab section 14 is in a second plane parallel to the first plane. Both the contact tab section 12 and the termination tab section 14 extend from the side of the C-shaped section occupied by the backbone of the C-shaped support section. In the preferred embodiment, the contact tab 12 is wider than the termination tab 14 and therefore the contact tab centerline, in the plane occupied by the contact tab 12, is laterally offset from the termination tab centerline, also in the plane occupied by the termination tab 14. As will be more fully described, the contact tab 12 comprises a blade that can be part of a separable connection with a mating terminal in a mating connector. The termination or weld tab 14 is intended for establishing a permanent connection with a discrete conductor, such as a wire 8, which forms a jumper as part of an interconnection to a printed circuit board 10. In the preferred embodiment of this invention the termination tab 14 comprises a weld tab suitable for the establishment of a wire bond connection. As shown in FIGS. 2 and 3 an aluminum inlay 18 is formed on both sides of the termination tab 14. This aluminum inlay comprises the bondable surface to which a wire 8 can be ultrasonically bonded. In the preferred embodiment, this aluminum inlay is approximately 0.003 inches thick. Gold or silver inlays could also be used.

The connector housing 4 has a mating face 22 and a rear face 24. These two faces 22 and 24 are located on oppositely facing surfaces of the housing 4. A housing ledge 26, in the form of a step, extends from the lower portion of the rear face 24. A shroud 38 encircles the mating face 22.

Figures 5, 6:
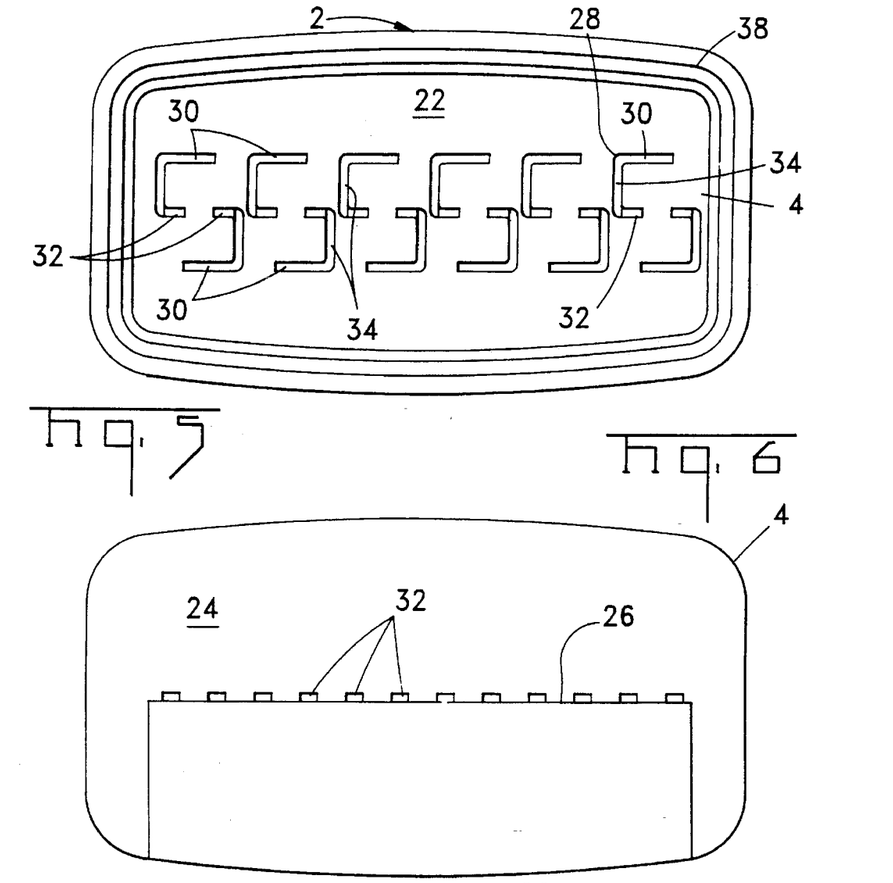
FIG. 5 is a front view of the housing showing the mating face and the openings in which the terminals are positioned.
FIG. 6 is a rear view of the housing showing the rear face of the housing and the ledge on which the termination tab portions of the terminals are positioned.
Figure 7:
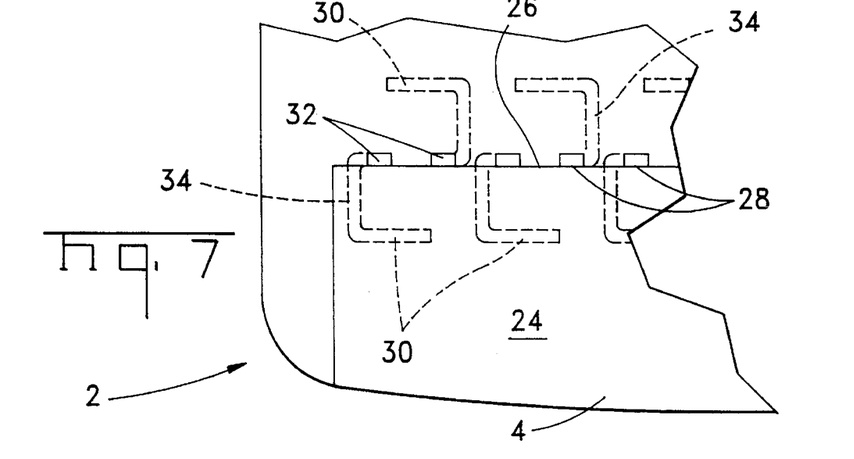
FIG. 7 is an enlarged view of the rear of the housing showing the hidden portion of the openings in the housing.

Housing terminal openings 28 extend through the housing 4 between the mating face 22 and the rear face 24. Openings 28 are positioned laterally side by side in the housing. Each opening 28 comprises a first section or arm or slot 30 which is spaced from a second section or arm or slot 32. An opening central section 34 on one side of the two slots 30, 32 joins the first slot 30 to the second slot 32. Both slots 30, 32 join the central section 34 on the same side 36, and the first slot 30 is parallel to the second slot 32. In this embodiment, the first slot 30 is wider than the second slot 32 and the centerlines of the two slots forming the same opening 28 are offset relative to each other. Openings 28 are substantially C-shaped, despite the fact that slot 32 is narrower than slot 30. As best shown in FIGS. 5 and 7, adjacent slots 28 are inverted. The second slots 32 are all side by side and occupy the same central plane. The first slots 30 are alternately spaced above and below the central plane occupied by the second slots 32. As seen in FIG. 6, the second slots 32, which extend through to the rear face 24 are all aligned with the top of the housing ledge 26. The first slots 30, which extend only to the mating face 22 are spaced alternately above and below the projection of the top surface of the ledge 26. While the second slots 32 are located in one row in the common central plane, the first slots 30 form two parallel rows on the mating face 24. The central sections 34 of the openings 28 extend vertically on opposite sides of pairs (first and second; third and fourth; fifth and sixth; etc.) of adjacent second slots 32. The vertical central sections 34 of adjacent openings 28 in different pairs (second and third; fourth and fifth, etc.) are closely adjacent. The first slots 30 of the same pair of openings (first and second; third and fourth; etc.) laterally overlap.

Figure 4:
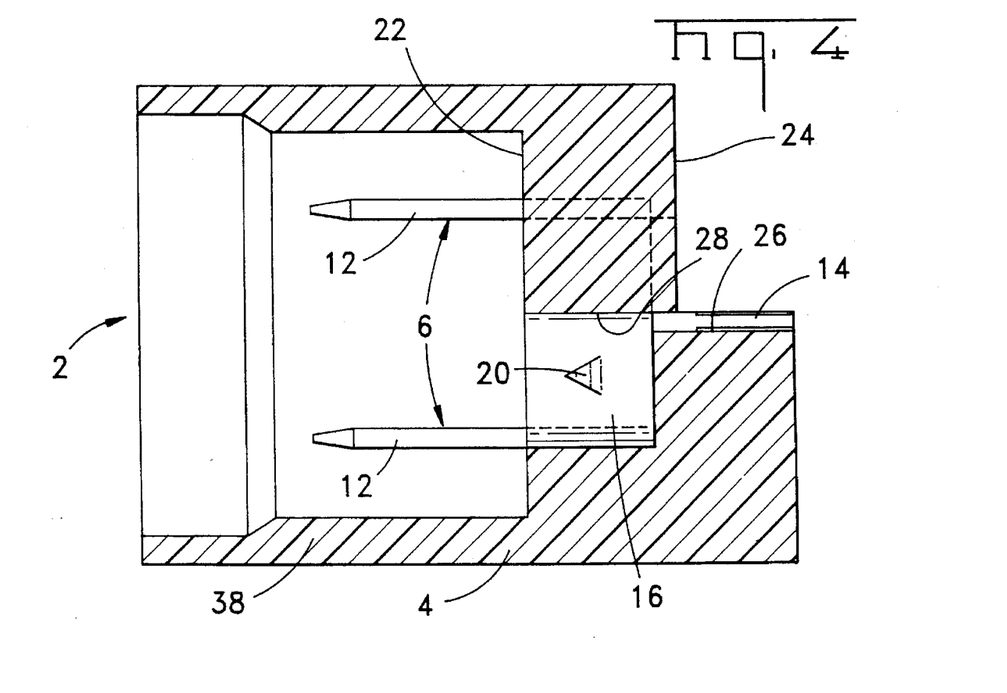
FIG. 4 is a section view of the connector showing two terminals in two different orientations in the housing.

As shown in FIG. 4, the terminals 6 are positioned in openings 28. The terminal contact tabs 12 extend forward of the mating face 22 into the area encircled by the housing shroud 38. The termination or weld tabs 14 extend rearward of the rear housing face 24 and extend along the upper surface of the housing ledge 26, which supports the termination tabs 14. The terminal support section 16 is positioned in the opening central section 34. In the embodiment shown in FIG. 4, the terminal support section 16 includes a retention barb 20 that engages an inner wall of the central section 34 of the corresponding opening 28. As shown in FIG. 4, the central section 34 and the terminal support section 16 located therein do not extend to the rear face 24. The terminal support section 16 abuts a rear wall of the central opening section 34. This embodiment is representative of configurations in which the terminals 6 are inserted into the openings 28 through the mating face 22. The end wall of central section 36 prevents further rearward movement of the terminal 6 and the retention barb 20 prevents extraction of the terminal 6 through the mating face 22. The terminals 6 could also be inserted through the rear face 24, provided of course that the retention barb and the end wall of the central section 36 were reversed. Retention barb 20 can be formed to be substantially rigid and to gouge the interior wall of the housing, or the barb can be flexible to snap over and engage a rearwardly facing shoulder in the orientation of FIG. 4. Alternatively, the dimensions of the terminals 6 and the openings 28 could be chosen to permit a press fit without the need for a retention barb. The terminals 6 can be dimensioned to insure a press fit with the housing 4 over at least a portion of their length to provide sealing integrity between the mating face 22 and the rear face 24. The terminals 6 could also be insert molded in the housing 4, in which case the openings 28 would be formed by the terminals themselves. If the terminals 6 are insert molded in the connector housing 4, a seal would be inherently established between the terminals 6 and the housing 4.

Figure 8:
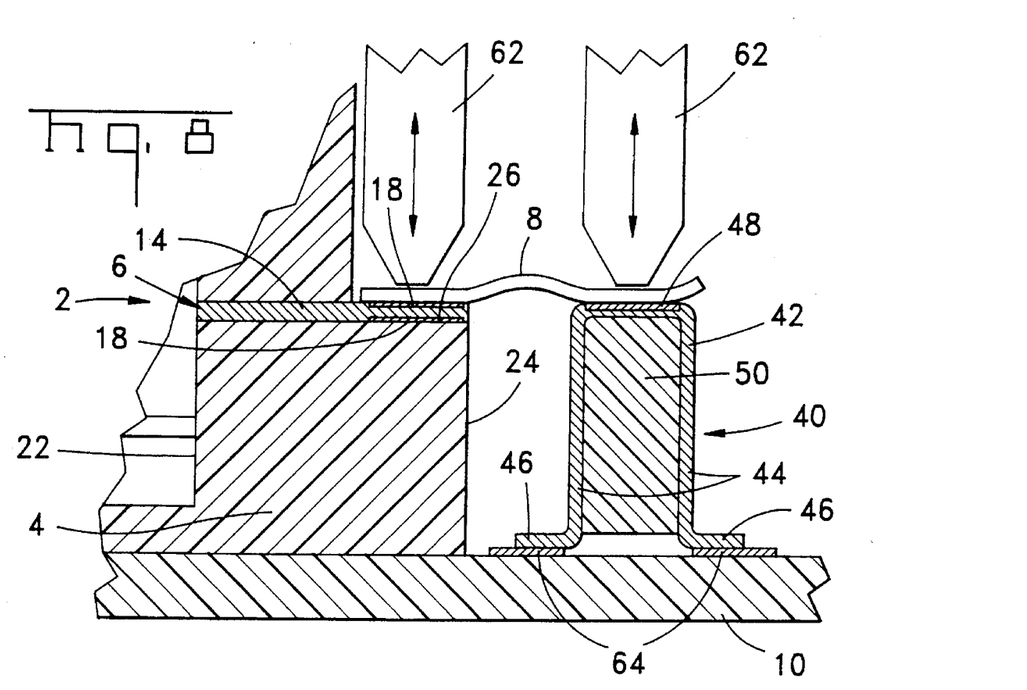
FIG. 8 is a side section view showing an ultrasonic applicator bonding a conductor both to the termination tab portion of a single terminal and to a bridging terminal on a bridge.
Figure 9:
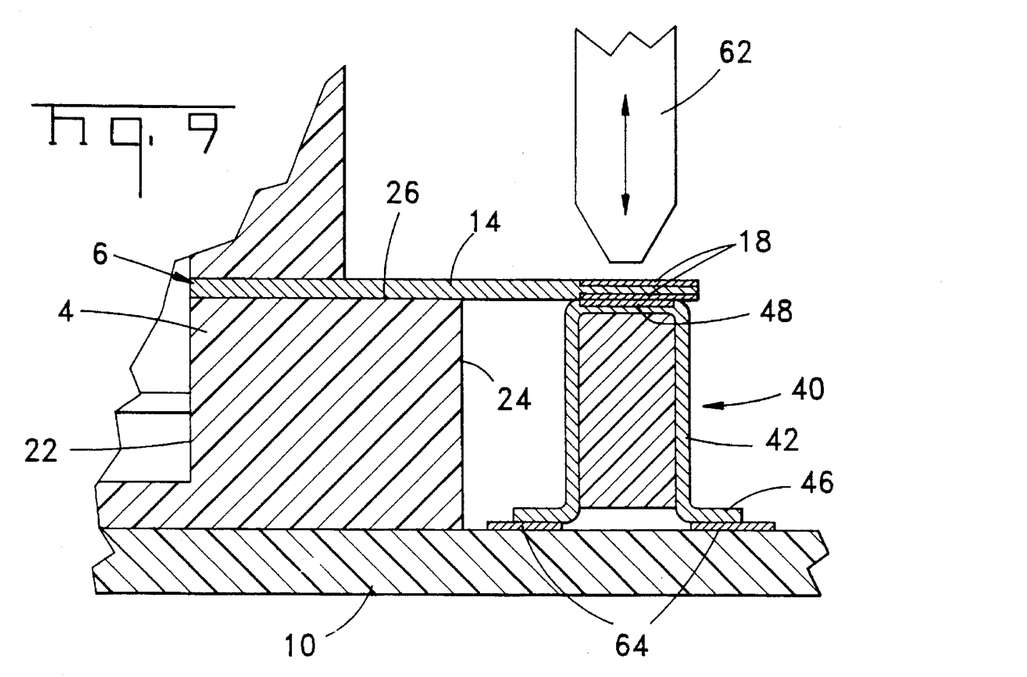
FIG. 9 is a side section view of an alternate embodiment in which the terminal is positioned on the bridge and the terminal is bonded directly to the bridging terminal.

FIGS. 8 and 9 show two alternate embodiments of the terminals 6. In the embodiment of FIG. 8, the termination tab or wire bonding section 14 of the terminal 6 is positioned on the ledge 26. The aluminum inlay 18 on one surface of the termination or weld tab section 14 faces upward and is accessible for a wire bonding operation. Since alternate terminals are inverted, aluminum inlays 18 must be provided on both surfaces of the termination tab section 14 of terminals 6. See FIGS. 2 and 3. Otherwise two different terminals would be necessary. The embodiment of FIG. 9 shows a configuration in which the termination tab section 14 is substantially longer and extends beyond the housing ledge 26 so that the tab is positioned directly on a bridge 40.

Figure 10:
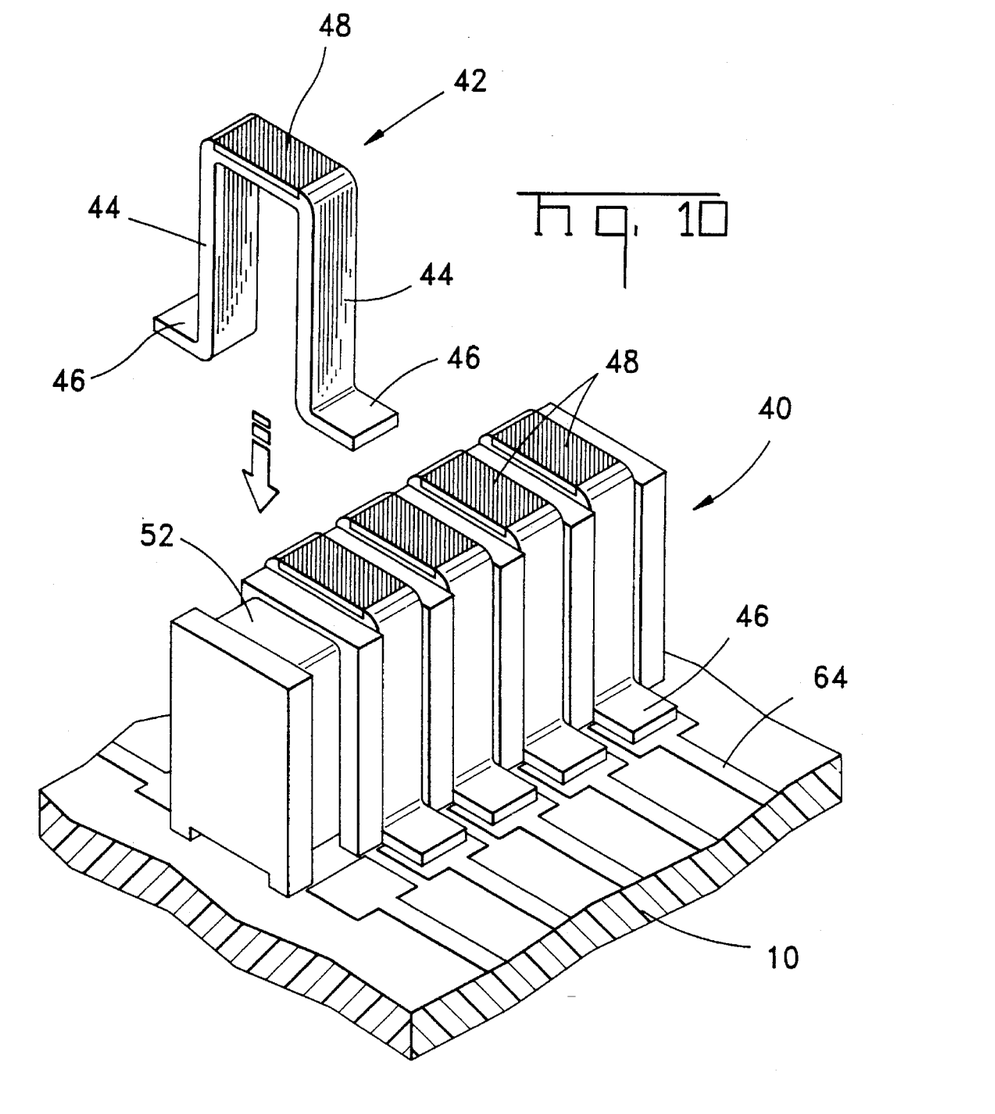
FIG. 10 is a perspective view of the bridge mounted on a printed circuit board with a single bridging terminal exploded from the bridge.

Both embodiments of FIGS. 8 and 9 employ a bridge 40 as part of the interconnection of terminals 6 to corresponding traces 64 on a printed circuit board 10. This bridge 40 is shown in more detail in FIG. 10. The bridge 40 includes bridging terminals 42 positioned on the exterior of a bridge body or pedestal 50. The bridging terminals 42 are positioned side by side and may be separated by a rib formed on the exterior of the pedestal 50. Bridging terminals 42 each have two bridging terminal legs 44 on opposite sides of a central wire bonding or bridging terminal section 48 which has an aluminum inlay suitable for wire bonding on its upper surface. Gold and silver inlays can also be used. Each bridging terminal leg includes a contact pad or foot, such as a surface mount lead section 46. These surface mount lead sections 46 are soldered to the trace pads at the end of traces 64 on printed circuit board 10. These surface mount lead sections 46 could be replace by through hole tails or by a press fit compliant pin section if a plated through hole were substituted for the surface mount pads on the printed circuit board 10. Any conventional technique for attaching terminals to printed circuit board could be used. For example an edge connector configuration could be substituted. Cost is the critical factor in selecting from a number of conventional and functionally acceptable options. The central wire bonding section 48 of the embodiments of FIGS. 8 and 9 are supported on the upper pedestal support surface 52, shown in FIG. 10. In each of the embodiments of FIGS. 8 and 9, the height of the pedestal support surface 52 is substantially the same as the height of the housing ledge 26. Thus the upwardly facing aluminum inlay 18 on the connector terminal 6 is in substantially the same plane as the upwardly facing 48 aluminum inlay on bridging terminal 42. An ultrasonically applicator 62 can then by easily positioned to bond a bare wire 8 to both aluminum inlays in the embodiment of FIG. 8. Either two separate applicators 62 can be employed or a single ultrasonic applicator can be used in two steps in the embodiment of FIG. 8. If a single applicator were used, the entire assembly would be moved between the two steps. In the embodiment of FIG. 9, only one applicator 62, or only one applicator operation is necessary.

Figure 11:
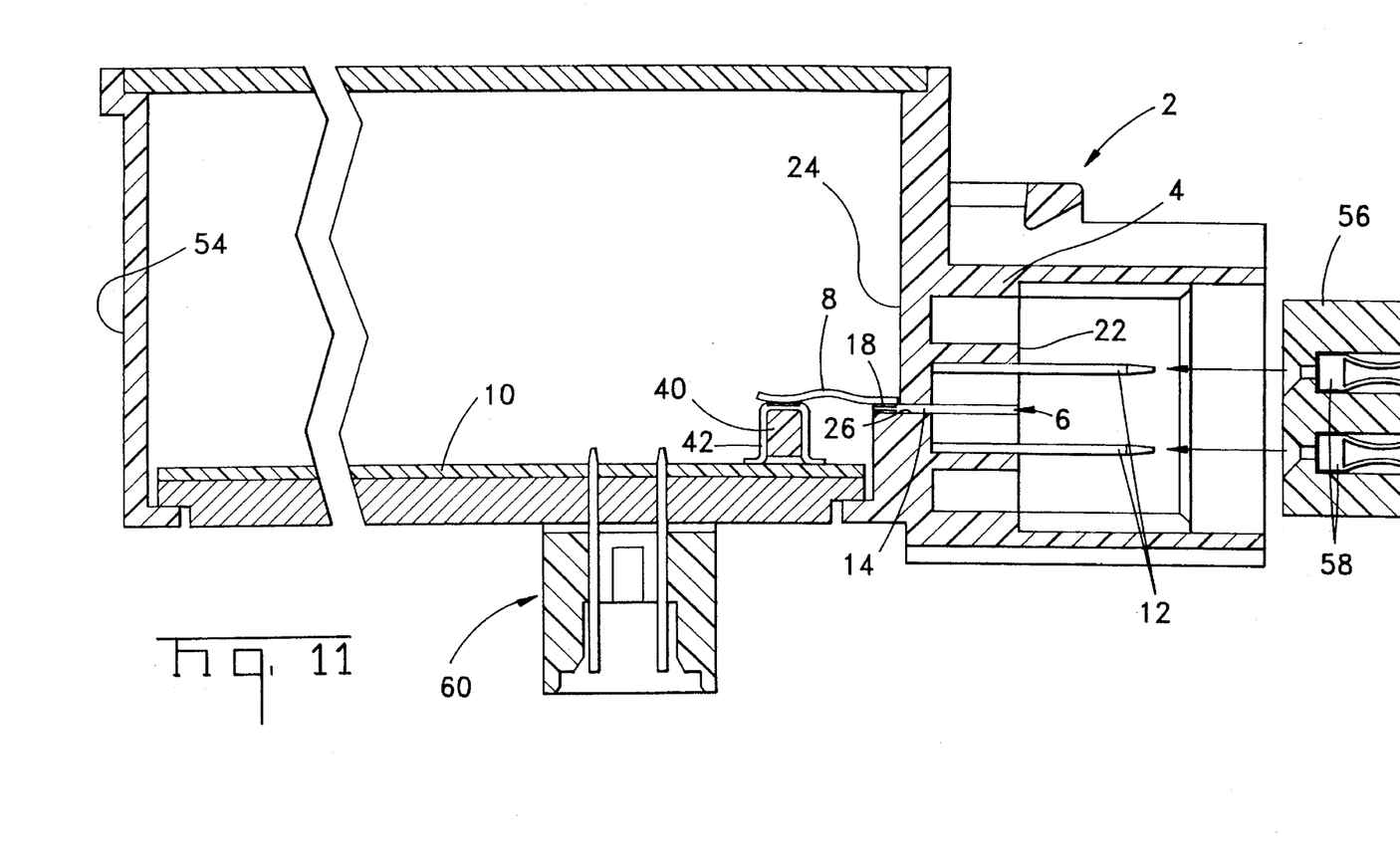
FIG. 11 is a view of an embodiment of an enclosure for the printed circuit board in which the connector is an integral part of the enclosure.

One application in which a connector of this type could be employed is shown in FIG. 11. An enclosure 54 includes a printed circuit board 10 positioned on the base of the enclosure. This printed circuit board would contain electronic components that are not shown in this figure. The specific components and the specific function of these components are not relevant to this invention. An auxiliary header 60 is located on the base of the enclosure 54 and is intended to show that auxiliary apparatus can be used with this assembly. The connector 2 is located on the side of the enclosure 54 and therefore on the side of the printed circuit board. The connector housing 4 is molded as an integral part of the enclosure 54.

The assembly shown in FIG. 11 is assembled in several steps. The printed circuit board assembly is assembled as part of a conventional board assembly operation. The bridge 40 is intended to be installed on the printed circuit board 10 as part of this conventional board assembly operation. Bridging terminals 42 are assembled on the pedestal body 50 prior to attachment of the bridge 40 to the printed circuit board 10. The surface mount bridging terminals 42 are soldered to the printed circuit board 10 as part of this operation. Conventional hold down apparatus may also be used on the pedestal body 50 to mechanically secure the bridge 40 to the printed circuit board 10 in a conventional manner.

Connector terminals 6 are inserted into the connector housing 4 through the mating face 22. The connector of FIG. 11 is substantially the same as that shown in FIGS. 1, 4 and 8. The termination portion 14 of terminal 6 is positioned on the top of the housing ledge 26 at the rear of the connector and on the interior of the enclosure 10. A wire bonding aluminum inlay section 18 faces upward. The printed circuit board 10 can be mounted in the enclosure 54 either before or after the terminals 6 are inserted into the housing. Bare wire 8 can then be positioned as shown. An ultrasonic applicator 62 can then be used to bond the wire both to the wire bondable aluminum inlay 18 on the connector terminals 6 and to the bridging terminal aluminum inlay bonding section 48 on the bridging terminals 42. A conventional mating electrical connector 56 with socket terminal 58 can then be used to form the separable connection with the contact tabs 12 on the mating face 22 in a conventional manner.

Although the embodiments depicted herein are specifically intended for the use of wire bonding to form the connection between the connector 2 and the printed circuit board, there are other process that can be used. For example a multiconductor jumper cable can be employed instead of individual bare wires 8. Stripped ends of these cables can then be soldered to the termination portions of these terminals. A hot bar soldering process can be used to simultaneously solder all of these conductors to the terminals. Alternatively wires can be individually soldered to the connector terminal and to the bridging terminals or directly to the printed circuit board.

Other approaches that do not include a wire bond or a solder connection can be used with a connector having inverted C-shaped terminals. For example an insulation displacement terminal can be employed as the termination section of these terminals. These insulation displacement terminations employ slots in which a wire can be attached by moving the wire laterally of its axis into the slot. Such a terminal would need to be inserted into the housing from the rear face instead of through the mating face because of the size of the insulation displacement terminal. Another similar application would use a conventional crimp terminal as the termination section of the terminal. Another application would use a compliant pin to form the connection between the connector terminals and the printed circuit board. In this application a hole would belocated in the termination section of each terminal and the housing ledge would also provide an opening between that terminal opening and pointed circuit board. A compliant pin section, such as that used on ACTION PIN connector terminals, would be located on a pin in position to engage the hole in the terminal. ACTION PIN is a trademark of The Whitaker Corporation. These pins would then be inserted through the hole in the termination section of the connectors terminals and the compliant pin section would then establish a permanent resilient contact with the edges of the hole in the connector terminal. The pin could then be soldered to the printed circuit board or another compliant pin section could be used to form a connection with a plated through hole in the printed circuit board. These are only a few specific examples of alternate embodiments of this invention as defined by the claims of various scope which follow.

We claim:

1. An electrical connector comprising an insulative housing and multiple terminals positioned laterally side by side in the insulative housing, each terminal further comprising:

a contact tab;

a termination tab; and a support section extending between the contact tab and the termination tab, the contact tab and the termination tab extending in opposite directions from the support section, the contact tab being positioned in a first plane and the termination tab being positioned in a second plane, at least a portion of the support section extending transverse to the first and the second planes, the contact tab having a contact tab centerline in the first plane, the termination tab having a termination tab centerline in the second plane, the contact tab centerline being laterally offset from the termination tab centerline.

2. The connector of claim 1 wherein the first and second planes are parallel.

3. The connector of claim 2 wherein said support section has a generally C-shaped cross section.

4. The connector of claim 1 wherein the contact tab and the termination tab each comprise flat blades.

5. The connector of claim 1 wherein the termination tab includes means for establishing a permanent electrical connection with a single conductor.

6. The connector of claim 5 wherein the termination tab includes a bondable section to which a wire can be bonded.

7. The connector of claim 6 wherein the bondable section comprises an aluminum inlay section.

8. The connector of claim 6 wherein a bondable section is located on both sides of the termination tab.

9. The connector of claim 1 wherein the width of the contact tab is greater than the width of the termination tab.

10. The connector of claim 1 wherein the terminals are positioned in the housing with the contact tabs of side by side terminals forming two parallel rows and the termination tabs being positioned in a single row.

11. The connector of claim 1 wherein adjacent terminals are inverted to position the contact tabs in two rows and to position the termination tabs in a single row.

12. The connector of claim 11 wherein the insulative housing includes a ledge on which the termination tabs are positioned.

13. The connector of claim 11 wherein the termination tabs extend from one face of the insulative housing and the contact tabs extend from an opposite second face.

14. The connector of claim 11 wherein the support section of each terminal includes a contact retention barb engaging the insulative housing to prevent retraction of the terminal from the housing.

15. The connector of claim 11 wherein each terminal is press fit in the housing.

16. The connector of claim 1 wherein the insulative housing includes openings in which the terminals are positioned, the openings being located in two rows, corresponding openings in the two rows being laterally offset.

17. The connector of claim 16 wherein each opening is C-shaped.

18. The connector of claim 17 wherein each C-shaped opening includes first and second parallel spaced apart sections, the spaced apart sections having laterally offset centerlines, the first section being coplanar with the contact tabs and the second section being coplanar with the termination tabs.

19. The connector of claim 16 wherein the openings on one row are inverted relative to the openings in the other row.

20. The connector of claim 19 wherein each opening includes a first section coplanar with the contact tab and a second section coplanar with the termination tab, the openings in the two rows being positioned with the second sections side by side and the first sections of adjacent openings being alternately vertically spaced above and below the second sections.

21. An electrical connector comprising a plurality of terminals positioned in an insulative housing, the housing having a mating face and a rear face with a series of openings extending between the mating face and the rear face, terminals being positioned in the openings, each opening being substantially C-shaped with first and second spaced apart slots joined by a transverse central slot, the central slot being located on one side of the spaced apart slots, adjacent openings being inverted so that the second slots in adjacent openings extend side by side in a common plane with the first slots in adjacent openings being located above and below the common plane so that identical terminals can be positioned in inverted positions in the inverted openings.

22. The electrical connector of claim 21 wherein the first slots are wider than the second slots.

23. The electrical connector of claim 21 wherein centerlines of the first slots are offset relative to the centerlines of the corresponding second slots.

24. The electrical connector of claim 21 wherein opposite ends of the terminals extend from the mating face and the rear face, the ends of the terminals extending from the mating face forming two rows and the ends of the terminals extending from the rear face forming one row.

25. The electrical connector of claim 21 wherein a ledge is formed on the rear face of the housing, the ledge being located below the second slots so that ends of the terminals protruding from the second slots are positioned on the ledge.

26. The electrical connector of claim 21 wherein the housing is integral with an enclosure, the enclosure having a printed circuit board positioned therein, the electrical connector comprising an input/output connector for the printed circuit board.

27. The electrical connector of claim 21 wherein the terminals are press fit in the openings.

28. The electrical connector of claim 21 wherein each terminal includes a retention barb engaging a wall forming the central slot in the corresponding opening in which the terminal is positioned.

29. The electrical connector of claim 21 wherein the terminals are insertable into the openings through one face of the housing.

30. The electrical connector of claim 21 wherein the terminals are stamped and formed and have flat blades protruding from the opposite mating face and rear face of the housing, the terminals including a C-shaped central support section positioned in the openings.

31. An assembly for connecting a plurality of inputs and outputs to a printed circuit board, the assembly comprising:

an electrical connector further comprising at least one connector terminal having a contact section for forming a separable connection with mating terminals in a mating electrical connector and a termination section;

a bridging terminal for each connector terminal, the bridging terminal including means for attaching the bridging terminal to the printed circuit board and a bridging terminal termination section, and a conductor attached between the termination section of each connector terminal and the bridging terminal termination section of each corresponding bridging terminal.

32. The assembly of claim 31 wherein the termination sections and the bridging terminal termination section each comprise weld tabs to which a wire can be bonded.

33. The assembly of claim 32 wherein the termination sections comprise weld tabs to which a wire can be ultrasonically bonded.

34. The assembly of claim 32 wherein the weld tabs on the connector terminals and on the bridging terminals are positioned in a common plane.

35. The assembly of claim 32 wherein the weld tabs comprise aluminum inlays.

36. The assembly of claim 31 wherein each bridging terminal is supported by a pedestal so that the bridging terminal termination section is spaced above the printed circuit board.

37. The assembly of claim 36 wherein a plurality of bridging terminals are positioned on each pedestal.

38. The assembly of claim 37 wherein the means for attaching the bridging terminal to the printed circuit board comprises at least one surface mount lead section.

39. The assembly of claim 38 wherein each bridging terminal comprises a U-shaped member straddling a pedestal.

40. The assembly of claim 31 wherein a plurality of connector terminals are positioned in the electrical connector with the contact sections being positioned in at least two rows and with the corresponding connector terminal termination sections being positioned in a single row adjacent to the corresponding bridging terminal termination sections.

41. The assembly of claim 31 wherein the electrical connector includes a housing, the housing being integral with an enclosure in which the printed circuit board can be mounted.

42. The assembly of claim 31 wherein each connector terminal termination section is ultrasonically bonded directly to a corresponding bridging terminal termination section.

43. A printed circuit board mounted bridging connector for connecting traces on the printed circuit board to external conductors, the bridging connector comprising:

a pedestal mountable on the surface of the printed circuit board adjacent to the traces with a support surface parallel to and spaced above the printed circuit board, and a plurality of bridging terminals mounted on the pedestal, each bridging terminal including a first printed circuit board lead section for attachment to the traces, the lead section being positioned beside the pedestal, and a flat conductor bonding section on the bridging terminals positioned on the support surface of the pedestal, the conductor bonding section comprising means for establishing an electrical connection to an conductor positioned on said bonding section upon the application of energy to the conductor and the bonding section.

44. The bridging connector of claim 43 wherein the bonding section comprises means for bonding to an external conductor in contact therewith upon the application of ultrasonic vibrations.

45. The bridging connector of claim 43 wherein the bonding section comprises means for bonding to an external conductor in contact therewith upon the application of heat.

46. The bridging connector of claim 43 wherein each bridging terminal straddles the pedestal.

47. The bridging connector of claim 46 wherein each bridging terminal comprises a U-shaped member with lead sections on each end thereof.

48. The bridging connector of claim 47 wherein each lead section includes a surface mount lead section.

* * * * *